United States Patent [19]
Akashi et al.

[11] Patent Number: 5,474,019
[45] Date of Patent: Dec. 12, 1995

[54] PROCESS FOR PRODUCING SILICON SINGLE CRYSTALS

[75] Inventors: Yoshihiro Akashi, Kobe, Japan; Kaoru Kuramochi, Montgomery, Ohio; Setsuo Okamoto, Nishinomiya, Japan; Yasuji Tsujimoto, Kobe, Japan; Makoto Ito, Saga, Japan

[73] Assignee: Sumitomo Sitix Corporation, Amagasaki, Japan

[21] Appl. No.: 322,197

[22] Filed: Oct. 13, 1994

[30] Foreign Application Priority Data

Oct. 18, 1993 [JP] Japan .................................. 5-259508

[51] Int. Cl.$^6$ .................................................. C30B 15/34
[52] U.S. Cl. ........................................................ 117/1; 117/28
[58] Field of Search ................................. 117/13, 28, 37, 117/208, 218, 931, 932; 437/983

[56] References Cited

U.S. PATENT DOCUMENTS 5,248,378  9/1993  Oda et al. .................................. 117/13

FOREIGN PATENT DOCUMENTS

| 9094582 | 9/1974 | Japan ......................................... 117/13 |
| 2-267195 | 10/1990 | Japan . |
| 3-275586 | 12/1991 | Japan . |
| 3-275598 | 12/1991 | Japan . |

OTHER PUBLICATIONS

Japanese Extended Abstracts (The 38th Spring Meeting, 1991); No. 1, The Japan Society of Applied Physics and Related Societies (Mar. 28–31, 1991), "Studies on Crystal Growing Conditions Concerning with Vox Failure," K. Kitagawa et al.
Japanese Extended Abstracts (The 39th Spring Meeting, 1992); The Japan Society of Applied Physics and Related Societies (Mar. 28–31, 1992), "Influence of Thermal History in CZ Crystal Growth Process on Dielectric Strength of Gate Oxide Films," Y. Komatsu et al.

Primary Examiner—R. Bruce Breneman
Assistant Examiner—Felisa Garrett
Attorney, Agent, or Firm—Burns, Doane, Swecker & Mathis

[57] ABSTRACT

A process and apparatus for producing silicon single crystals with excellent dielectric strength of gate oxide films by adjusting the temperature gradient of the pulled-up silicon single crystal without loss of its rate of pulling. The process of producing silicon single crystals by pulling up the single crystal from a melt of material of the single crystal imposes a certain average temperature gradient on the grown single crystal while it is still at high temperature. The apparatus is provided with a heating element outside a crucible and pulling shaft with which a single crystal is pulled up from the melt of the material in the crucible. The ratio of length h of the heating element to the inside diameter $\phi$ of the crucible is adjusted so as to be between 0.2 and 0.8 whereby the temperature gradient can be maintained below 2.5° C./mm.

15 Claims, 5 Drawing Sheets

PROCESS FOR PRODUCING SILICON SINGLE CRYSTALS

FIELD OF THE INVENTION

The present invention relates to a process and an apparatus for producing single crystals, specifically silicon single crystals which have excellent dielectric strength of gate oxide films.

DESCRIPTION OF THE PRIOR ART

Among a number of methods, Czochralski process has been widely applied to production of silicon single crystals because it is a feasible industrial method for producing single crystals.

FIG. 7 is a schematic cross section to show how Czochralski process is realized, in which (1) indicates a crucible. A heating element (2) is installed outside the crucible (1), the crucible contains the melt (4) of the material of the single crystal which is the original material for forming the single crystal melted by the heating element. The lower end of the seed crystal held with a pulling shaft or a pulling wire is lowered to contact the surface of the melt, then the pulled crystal (3) grows and becomes solidified out of the melt at the lower end of the crystal.

Recently as the degree of integration of MOS devices increases, requirements for various characteristics have been imposed on silicon wafers, which are fabricated from the pulled single crystals. The requirement of high reliability for the gate oxide films is strict, because the intensity of the electric field applied to the films as stress is enhanced under a constant single source voltage, while thinning of the gate oxide films advances with decreasing dimensions of the integrated circuits for DRAM.

Dielectric strength of gate oxide films is one of the material characteristics which has decisive importance upon the reliability of the product. Therefore, development of the single crystals and their production technology is urgently needed.

Two methods have been proposed for the process of producing single crystals which have excellent dielectric strength of gate oxide films.

First, a process for producing silicon single crystals was developed using Czochralski technique with a limit of 0.8 mm/min or less for growing the single crystal in order to improve dielectric strength of gate oxide films of the crystal (See Laid-open (Kokai) No. 2-267195). As a result, in accordance with this method, when the dielectric strength of gate oxide films is evaluated in terms of the voltage ramping method, which will be explained later, the ratio of the number of acceptable MOS diodes is beyond 60%; if the average strength of the electric field imposed on the oxide films formed on the silicon wafer is above 8.0 MV/cm, no dielectric breakdown of insulation of the oxide films occurs.

However, the rate of crystal growth is equivalent to the rate of pulling up of the silicon single crystal and is directly connected to the rate of producing the silicon crystal. The rate of pulling up silicon single crystals in industrial production is generally greater than 1.0 mm/min, and reducing the rate of pulling up, as is indicated in the method mentioned above, means a sharp lowering of productivity of silicon single crystals. Also it is a matter of concern in the generation of oxidation induced stacking faults in the silicon single crystal which have a low rate of pulling up below 0.8 mm/min.

Secondly, there is a report about the effects of the thermal history in the process of pulling up single crystals in accordance with Czochralski process upon dielectric strength of oxide films (See 30P-ZD-17, The Japan Society of Applied Physics Extended Abstracts, The 39th Autumn Meeting, 1992).

According to this report, the dielectric strength of gate oxide films of a silicon wafer is largely dependent on the rate of crystal growth. It is not dominated, however, by the rate of crystal growth solely, but is consequently dependent upon the varying thermal history during the crystal growth. It has been reported also that the nuclei of imperfections in crystals, which reduce dielectric strength of gate oxide films, are formed during the crystal growth by pulling, the nuclei contracting in the high temperature range (above 1250° C.) and grown in the low temperature range (below 1100° C.). Here, the term, thermal history, refers to the heat patterns to which the single crystal is exposed during the cooling stage from the temperature of solidification while the single crystal is pulled up. It is said that the dielectric strength of the silicon wafer can be improved by adjusting the thermal history of the silicon single crystal during its growth by crystal pulling.

It is true that the nuclei imperfections may be contracted, extinguished, or diminished by slow cooling the crystal at high temperature. In the above mentioned report, adjustment of the cooling rate is attained by interrupting pulling up of the single crystal to stop its growth and to hold it as is for 30 minutes, and then the pulling is resumed so that the growth of the single crystal can continue. This way of adjusting the thermal history is a feasible measure for an experimental analysis, but cannot be used for industrial production of silicon single crystals. The problem with the known process of producing single crystals which have excellent dielectric strength of gate oxide films has been that it was not applicable to industrial production of silicon single crystals.

SUMMARY OF THE INVENTION

The objects of this invention are the process and the apparatus which enable production of silicon single crystals with excellent dielectric strength of gate oxide films by adjusting the temperature gradient in the silicon single crystal to improve the thermal history to which the silicon single crystal is exposed, without an extreme reduction of the rate of pulling up.

This invention provides a method for producing silicon single crystals and an apparatus for producing silicon single crystals.

According to the method of the invention, a single crystal is grown by pulling up the crystal from a melt of original material for the crystal contained in a crucible and heated to form the melt by a heating element installed outside the crucible. The method is characterized by giving a prescribed average temperature gradient to the grown single crystal while it is still at a high temperature range in order to obtain a silicon single crystal which has excellent dielectric strength of gate oxide films.

The apparatus according to the invention for producing silicon single crystals with excellent dielectric strength of gate oxide films includes a heating element outside a crucible and a pulling mechanism to pull up the single crystal from a melt of material for the crystal contained in the crucible, in which a ratio of a length of the heating element (h) to an inside diameter of the crucible ($\phi$) is characterized by being between 0.2 and 0.8.

DETAILED DESCRIPTION OF THE INVENTION

This inventor investigated in detail the method of adjusting the thermal history of the silicon single crystal during the crystal growth by pulling up the crystal in order to accomplish the process of producing silicon single crystal which has excellent dielectric strength of gate oxide films.

A rate of pulling of silicon single crystal larger than a certain rate is required in order to produce the silicon single crystal on an industrial scale. The thermal history to cool slowly at a high temperature range under certain conditions of pulling so that defect nuclei shrink and disappear can be realized by adjusting the temperature gradient at a high temperature range (above 1250° C.) when the crystal is cooled down from the temperature of solidification. The temperature gradient is related to the cooling rate and shows the temperature difference (° C.) per a unit length (1 mm) of the single crystal, and is represented by the average temperature gradient in ° C./mm for a specific temperature range between the beginning and the end of cooling.

Figure 2:
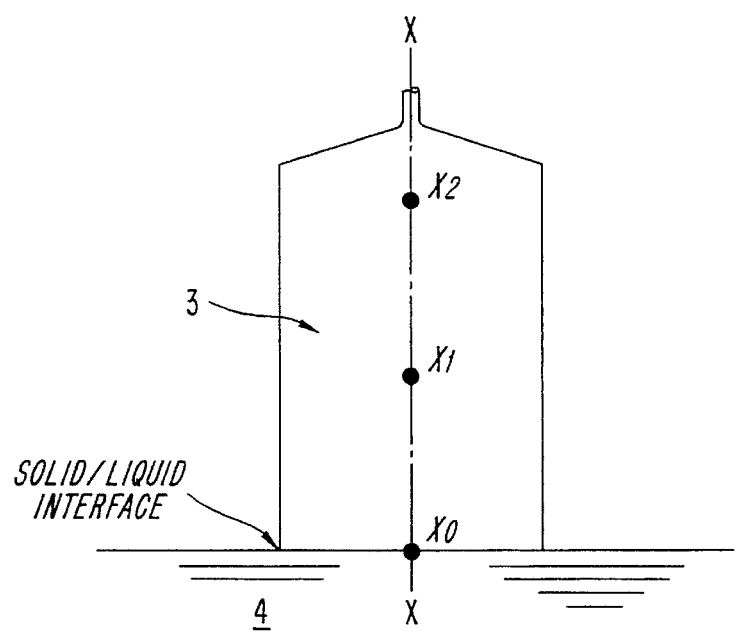
FIG. 2 is an illustration of a schematic drawing of the pulled single crystal relative to the melt and the surface of the melt.

FIG. 2 schematically shows the pulled crystal rod (3) relative to the melt (4) and to the solid/liquid interface. $X_0$ in FIG. 2 is the interface on an X—X central axis of the rod which shows where the crystal begins to solidify. $X_1$ and $X_2$ are locations in the crystal rod on the X—X axis, and the distances from the interface $X_1 < X_2$.

Figure 3:
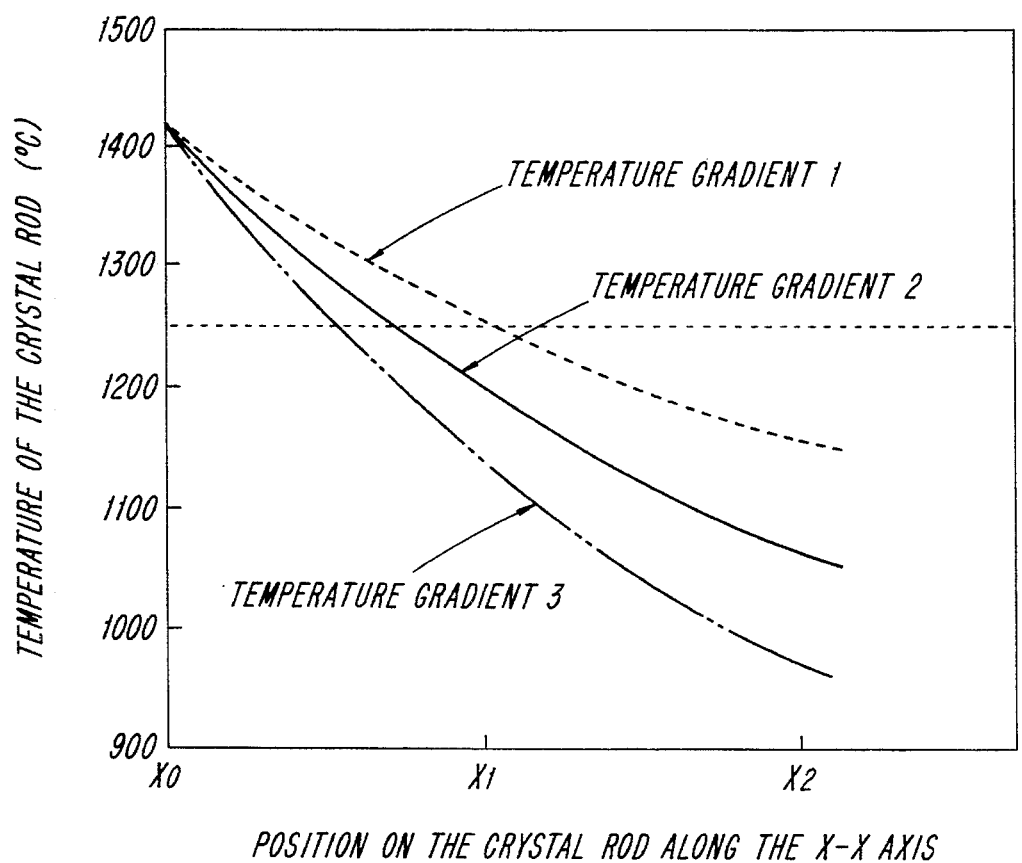
FIG. 3 is a drawing showing the results of the simulation for the crystal temperature distribution on X—X axis in which case the temperature gradient in the pulled crystal is varied from ① through ③ at a constant rate of pulling up.

FIG. 3 shows the results of simulation of the temperature distribution along the X—X axis in the pulled crystal rod (3) with different temperature gradients ① to ③ for a constant rate of pulling. The temperature gradient immediately below the solidification temperature (1410° C.) is relatively large and tends to decrease with the progress of pulling. The temperature gradient varies with the temperature of the pulled crystal rod or with the distance from the interface, and it is convenient to use the average temperature gradient (° C./mm) in analysis of the thermal history. The average temperature gradients ° C./mm here have been set to be ①<②<③.

It can be seen from FIG. 3 that the thermal history of cooling in the high temperature range can be realized by adjusting the temperature gradient. At location $X_1$, the temperature at gradient ① is higher than 1250° C. and the temperature at gradient ③ is already as low as about 1100°.

Consequently, a thermal history of slow cooling at a high temperature range is realized with the temperature gradient ① compared with the temperature gradient ③. By adjusting the temperature gradient appropriately the nuclei of imperfections in crystals disappear which adversely affects the dielectric strength of gate oxide films.

Figure 1:
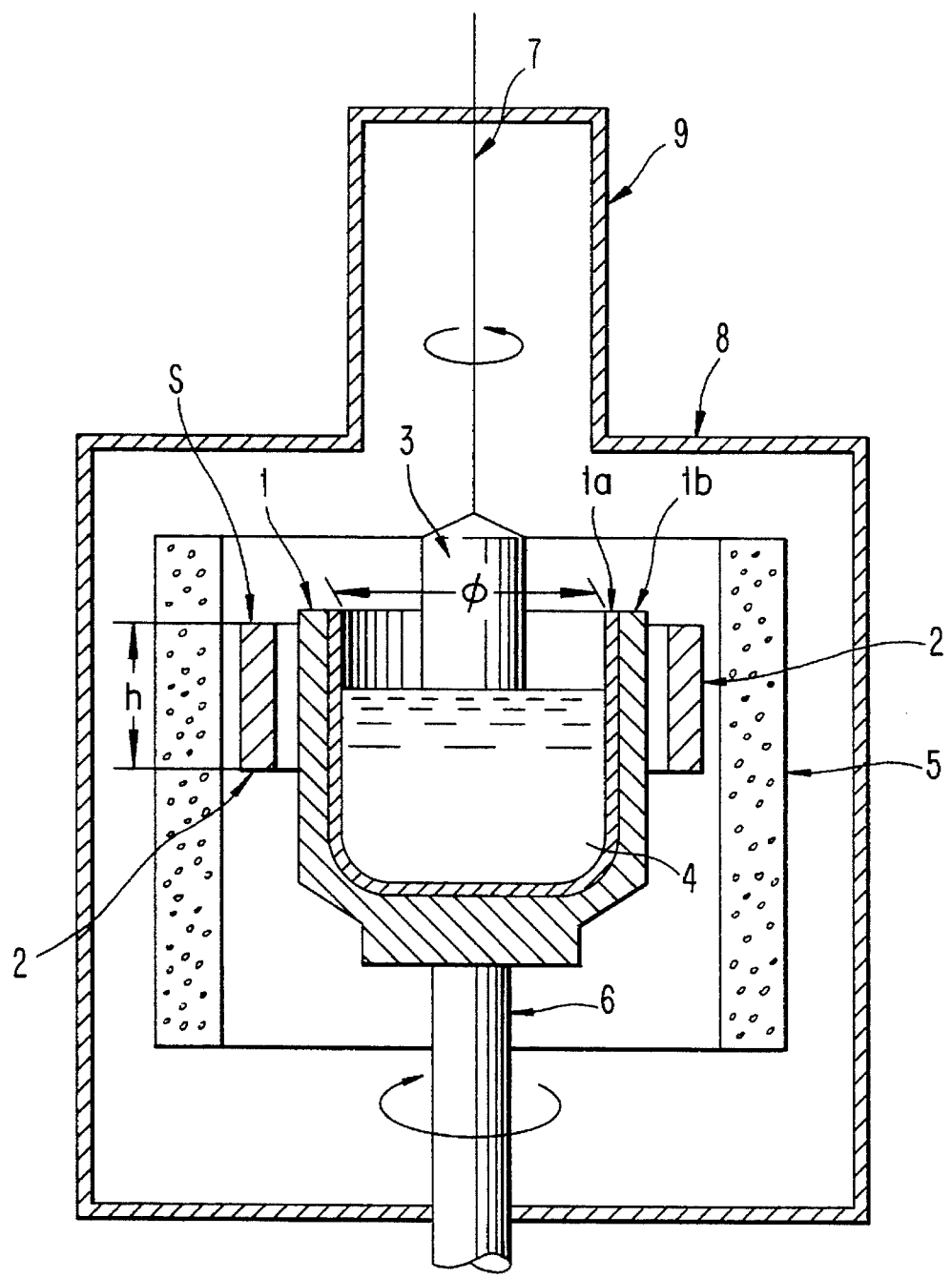
FIG. 1 is an illustration of a schematic cross section of an example of an apparatus in accordance with this invention.

With the apparatus for pulling crystals which is constituted of the crucible (1) and the heating element (2) as shown in FIG. 1, selecting the inside diameter of the crucible and the dimensions of the heating element allow adjustment of the average temperature gradient and variation of the thermal history.

The knowledge has been derived based on extensive investigation but at this time a theoretical basis has not been established. If, however, the position of installing the heating element (the relative position to the surface of the melt in the crucible) is properly selected and a short length h of the heating element relative to the crucible diameter φ is chosen, the temperature in the melt (4) about the solidification temperature of the crystal can be raised and the average temperature gradient in the solidified crystal can be lowered, and the temperature of the pulled crystal (3) can be maintained at high temperature above 1250° C. for a long period of time. Presumably, the reason is that, if the length h of the heating element is shorter relative to the crucible diameter φ, the radiation flux to the melt (4) from the heating element (2) increases.

FIG. 1 illustrates a vertical cross section of a preferable embodiment of the apparatus in accordance with this invention. It is preferable to have the upper edge S of the heating element within the range between +100 mm to -100 mm relative to the surface of the melt (4). The height of the upper edge S of the heating element is represented by positive values for the position above the surface of the melt and negative values for that below the surface of the melt. The upper limit +100 mm of the upper edge S of the heating element has been determined to prevent too large of a temperature variation of the melt caused by convection of the melt, and the lower limit -100 mm has been determined to prevent solidification in the upper edge of the crucible.

If the heating element (2) with a determined length relative to the crucible diameter φ is placed near the surface of the melt which is the location of solidification, the temperature of the melt (4) near the location of solidification of the crystal is raised, and the average temperature gradient in the pulled crystal (3) in the high temperature range can be reduced.

Figure 4:
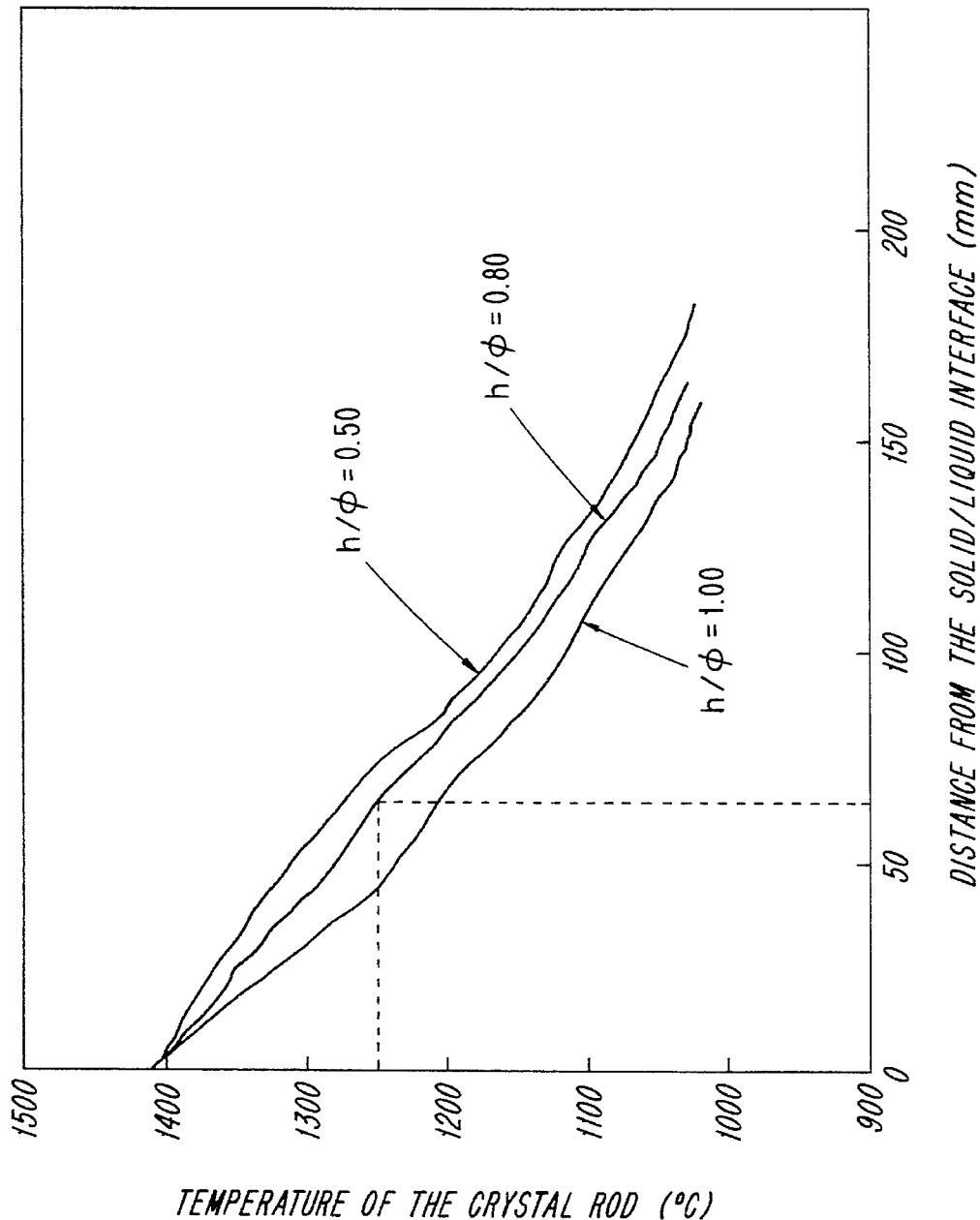
FIG. 4 is an illustration of the curves showing the thermal history of the single crystals for cases where the ratio h/φ of the length of the heating element (h) to the inside diameter of the crucible (φ) is varied under the conditions of a constant pulling rate, 1.0 mm/min and a constant input electric power to the heating element.

FIG. 4 shows the thermal histories of the pulled single crystals when the ratio of the length h of the heating element to the crucible diameter φ, h/φ is varied with a constant level of the upper edges of the crucible and with a constant input of the electric power. The thermal history is measured with the thermocouple vertically inserted into the pulled crystal.

The distance from the interface between the solid and the liquid in FIG. 4 represents the lapse of time after solidification of the single crystal. Since the rate of pulling the crystal is kept constant, a longer length from the interface between the solid and the liquid represents a longer time after the solidification of the single crystal. As h/φ is reduced, the average temperature gradient of the pulled crystal at a high temperature range is reduced. Consequently, the pulled crystal is maintained at a high temperature range for a long period of time. For $h/\phi=0.8$ the average temperature gradient between the solidification temperature and 1250° C. is 2.5° C./min.

Figure 5:
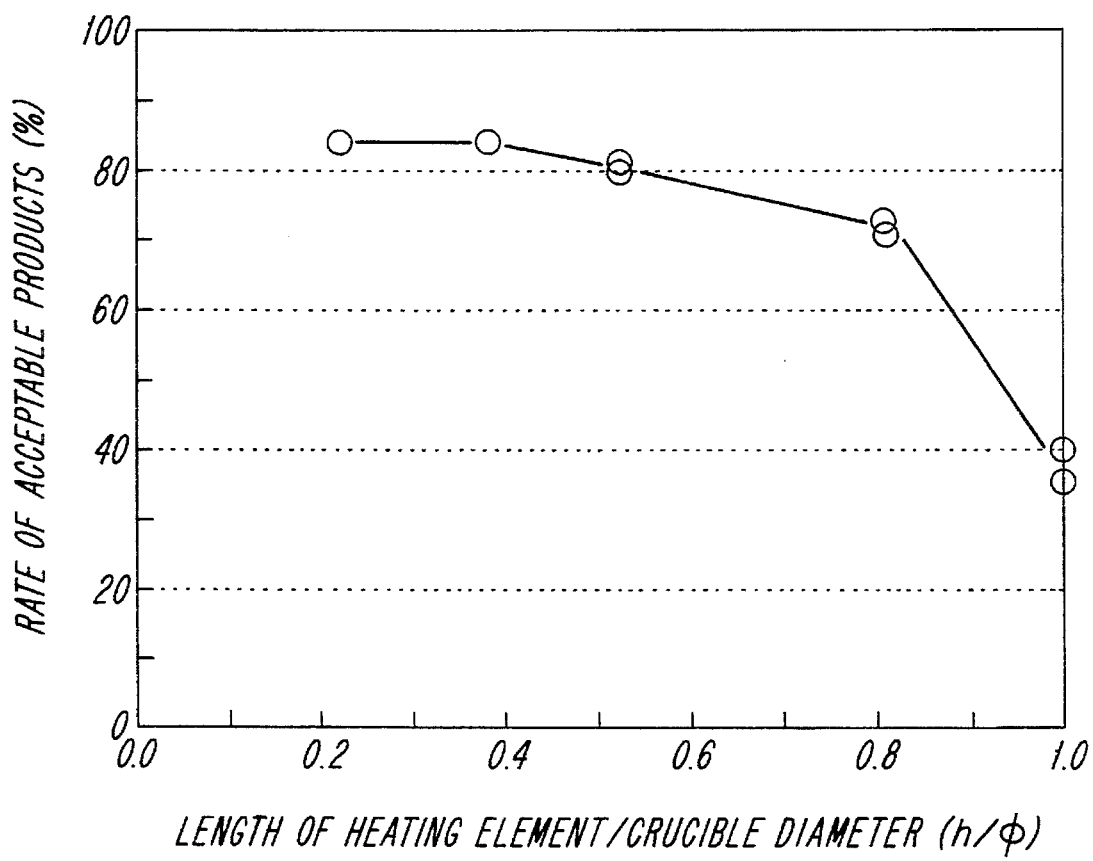
FIG. 5 is an illustration of the variation of the ratio of wafers of acceptable dielectric strength of gate oxide films with variation of h/φ, the ratio of the length of the heating element (h) to the inside diameter of the crucible (φ)

FIG. 5 shows the acceptance rate of the dielectric strength of oxide films of silicon wafers evaluated by a voltage ramping method. With $h/\phi$ below 0.8, a favorable result of the acceptance ratio above 70% has been obtained.

It can be seen from FIG. 4 and FIG. 5 that favorable states are realized as to dielectric strength of gate oxide films for smaller $h/\phi$; however, its lower limit is set at $h/\phi=0.2$ in this invention. The test results by this inventor indicates that smaller $h/\phi$ tends to create a non-uniform temperature distribution in the melt, and the lower limit is selected in consideration of the pulling rate of the crystal. If a certain degree of fluctuation in the temperature of the melt occurs, a stable crystal growth can be achieved by slowing down the pulling rate as to the growth of the single crystal. However, maintaining the rate of pulling above 0.8 mm/min is required in order to industrially produce silicon single crystals with the quality which are free from the problems of oxidation induced stacking faults. Thus, the lower limit of $h/\phi$ has been set at 0.2 as the required limit for the stable growth of the single crystal with the pulling rate above 0.8 m/min.

EXAMPLES

An embodiment of the process of growing single crystals in accordance with this invention is shown in FIG. 1. The notation used to label the drawing in FIG. 1 is the same in previous drawings.

FIG. 1 shows a schematic cross section of the apparatus to carry out the process of this invention. A crucible (1) consists of a double-layered structure, of which the inside is a quartz crucible (1a), and the outside is a graphite crucible (1b). This crucible is placed upon a crucible shaft (6). The crucible shaft is equipped with the function to lift the crucible as well as to rotate it.

A chamber (8) is a cylindrical vacuum vessel with a pulling shaft (7) of the single crystal located along its center line, and the crucible is placed at the center of the chamber. A heating element (2) which consists of resistance elements is located outside and surrounds the crucible. In addition, the heating element is surrounded by a heat insulating cylinder (5). The heating element is equipped with a lifting device, although it is not shown in the drawing. The relationship between the level of the melt surface in the crucible and the vertical position of the heating element can be adjusted in terms of the relative vertical position between the crucible and the heating element.

The pulling shaft (7) which can be lifted and lowered is installed above the crucible through the pulling chamber (9) connected to the upper part of the chamber (8), and the pulled crystal (3) is connected to the lower end of the pulling shaft.

The pulled crystal is rotated and pulled up as the pulling shaft is rotated and pulled; a single crystal grows at its lower end where it contacts the surface of the melt (4).

The pulled single crystal was a P type silicon single crystal of 6 inch diameter with <100> crystallographic orientation. The crucible used was 206 mm (16 inch) in diameter and 365 mm (14 inch) in height. The heating element used for this was 150 mm long, with $h/\phi=0.37$.

Other variables are $h/\phi$ from 0.20 to 1.50, as shown in Table 1.

As a pretreatment for crystal growing solid crystalline material in blocks, chips, and granular forms of crystalline silicon were charged in the crucible in preparation for crystal growing. The quantity of the material weighed 65 kg so that a 6 inch single crystal of an appropriate length could be pulled up.

After the solid material for crystal growing was melted in the crucible, the chamber was filled with argon (Ar) to maintain an atmospheric pressure of 10 Torr in the chamber. Then the heating element was raised to a position where the upper end S of the heating element was between −150 mm and +150 mm; namely the heating element was adjustable to be situated near the melt surface, and the single crystal was pulled up. Table 1 shows the conditions of processing in accordance with this invention and other examples for comparison.

The silicon single crystals were processed through industrial steps commonly required such as slicing and polishing. MOS diodes were mounted on the surface in order to evaluate the dielectric strength of gate oxide films of the wafer. In mounting a MOS diode, a silicon wafer was coated with oxide films, and then gate metallization was carried out. Coating the wafer with oxide films was carried out by heating the wafer in an oxidized atmosphere. The film used was a 25 nm thick dry oxide film. The gate was formed with phosphorus (P)-doped polycrystalline silicon, the area of which was 8 $mm^2$.

A voltage ramping method, which is an electric method to evaluate an oxide film, was used for evaluation of the oxide films of this silicon wafer.

Figure 6:
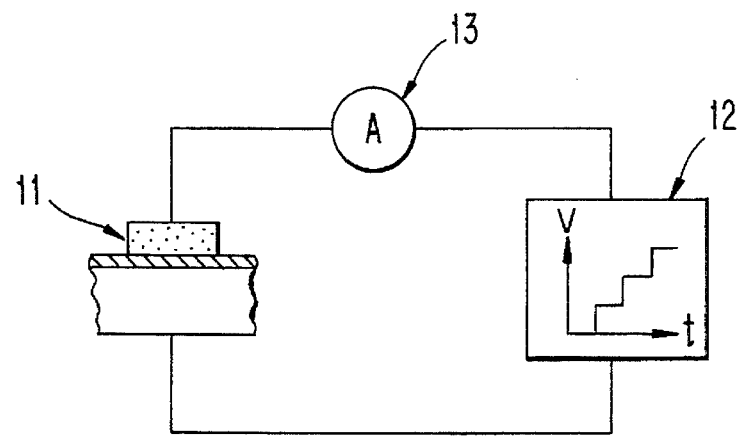
FIG. 6 is a schematic diagram of the voltage ramping method of evaluating dielectric strength of gate oxide films.
Figure 7:
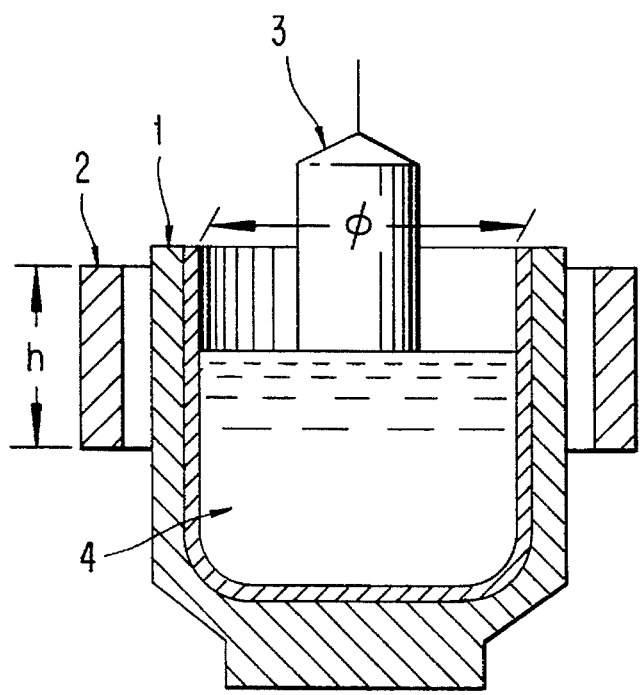
FIG. 7 is a schematic cross section of a process of producing a single crystal in accordance with the Czochralski process.

FIG. 6 schematically shows the measurement by the voltage ramping method. Increments of electric voltage were applied on the silicon wafer (11) mounted with a MOS diode, and the voltage was raised by increments of one volt by adjusting the direct current source (12), The leakage current is monitored with a current-meter (13). Dielectric strength of gate oxide films is evaluated by taking 100 to 150 measurement points within a silicon wafer surface, observing the dielectric breakdown at each point, and determining the acceptability of the silicon wafer. If a leaking current of 12.5 $\mu A/cm^2$ is measured in the dielectric strength, it is determined that a breakdown has occurred. If a measurement point has broken down at an average electric field less than 8 Mv/cm, that point is rejected and the ratio of acceptable points covering all the wafer surface represents the acceptance ratio. Generally speaking, the dielectric strength of gate oxide films depends on the acceptance ratio of the silicon wafers.

Results of measurements are shown in TABLE 1.

TABLE 1

| | Rod No. | Crystal pulling rate mm/min | Ratio, heater length to crucible dia. h/ø | Height of upper edge of heater mm | Rate, accept. DSO+ % |
|---|---|---|---|---|---|
| Example in accordance with this invention | A | 0.8 | 0.20 | 0 | 85 |
| | B | 0.9 | 0.37 | 0 | 80 |
| | C | 0.9 | 0.37 | +100 | 85 |
| | D | 0.9 | 0.37 | +150** | 70 |
| | E | 1.0 | 0.50 | 0 | 80 |
| | F | 1.0 | 0.50 | −100 | 80 |
| | G | 1.0 | 0.50 | −150** | 60 |
| | H | 1.0 | 0.80 | 0 | 70 |
| | I | 1.0 | 0.80 | −100 | 70 |

TABLE 1-continued

|  | Rod No. | Crystal pulling rate mm/min | Ratio, heater length to crucible dia. h/ø | Height of upper edge of heater mm | Rate, accept. DSO+ % |
|---|---|---|---|---|---|
|  | J | 1.0 | 0.80 | −150** | 55 |
| Other | K | 1.0 | 1.00 | 0 | 50 |
| example | L | 1.0 | 1.00 | −100 | 45 |
|  | M | 1.0 | 1.50 | 0 | 40 |

**indicates that the upper edge is out of the preferable range.
DSO+ stands for dielectric strength of gate oxide films It can be seen from TABLE 1 that the acceptance ratio for the comparative examples for comparison is low; however, the acceptance ratio of single crystals in accordance with this invention is remarkably high.

There had been no occurrence of problems with quality such as oxidation induced stacking fault in any of the single crystals.

As has been explained so far, production of silicon single crystals which have excellent dielectric strength of gate oxide films can be carried out. The forthcoming demand for better reliability of the gate oxide films accompanied with higher integration of MOS devices can be coped with the process and using the device in accordance with this invention without loss of productivity of single crystals.

What is claimed is:

1. A process of producing a silicon single crystal exhibiting improved dielectric strength of gate oxide films, the process comprising steps of:

pulling a silicon single crystal from a melt of material in a crucible surrounded by a heating element, the silicon single crystal being pulled in a vertical direction from a melt surface of the melt;

adjusting heat supplied to the crucible by the heating element such that a grown portion of the silicon single crystal above 1250° C. has a temperature gradient along the vertical direction of below 2.5° C./mm.

2. The process of claim 1, wherein the pulling step is carried out such that the silicon single crystal is pulled at a pulling speed of at least 0.8 mm/min.

3. The process of claim 1, wherein the adjusting step includes positioning the heating element relative to the melt surface such that an upper edge of the heating element is located within a range in the vertical direction of +150 mm to −150 mm from the melt surface.

4. The process of claim 1, wherein the adjusting step includes positioning the heating element relative to the melt surface such that an upper edge of the heating element is located within a range in the vertical direction of +100 mm to −100 mm from the melt surface.

5. The process of claim 1, wherein the adjusting step includes maintaining a ratio of length h in the vertical direction of the heating element to inner diameter φ of the crucible such that h/φ is 0.2 to 0.8.

6. The process of claim 1, wherein the pulling step is carried out in a vessel evacuated to a pressure of 10 Torr or less.

7. The process of claim 6, wherein the pulling step is carried out in a vessel evacuated to a pressure of 10 Torr or less.

8. The process of claim 1, further comprising forming the melt by melting silicon polycrystalline material in the crucible.

9. The process of claim 1, further comprising forming the melt by melting silicon polycrystalline material in the crucible.

10. A process of producing a silicon single crystal exhibiting improved dielectric strength of gate oxide films, the process comprising steps of:

pulling a silicon single crystal from a melt of material in a crucible surrounded by a heating element, the silicon single crystal being pulled in a vertical direction from a melt surface of the melt;

adjusting heat supplied to the crucible by maintaining a ratio of length h in the vertical direction of the heating element to inner diameter φ of the crucible such that h/φ is 0.2 to 0.8.

11. The process of claim 10, wherein the pulling step is carried out such that the silicon single crystal is pulled at a pulling speed of at least 0.8 mm/min.

12. The process of claim 10, wherein the adjusting step includes positioning the heating element relative to the melt surface such that an upper edge of the heating element is located within a range in the vertical direction of +150 mm to −150 mm from the melt surface.

13. The process of claim 10, wherein the adjusting step includes positioning the heating element relative to the melt surface such that an upper edge of the heating element is located within a range in the vertical direction of +100 mm to −100 mm from the melt surface.

14. The process of claim 10, wherein the adjusting step is carried out such that each portion of the silicon single crystal adjacent the melt at temperatures between 1250° C. and 1410° C. is cooled so as to maintain a temperature gradient in the vertical direction of 2.5° C./mm or less.

15. The process of claim 10, wherein the heating element is supplied a constant input of electrical power during the pulling step.

* * * * *